United States Patent
Chang et al.

(10) Patent No.: US 8,766,441 B2
(45) Date of Patent: Jul. 1, 2014

(54) METHODS AND APPARATUS FOR SOLDER ON SLOT CONNECTIONS IN PACKAGE ON PACKAGE STRUCTURES

(75) Inventors: Wei Sen Chang, Jinsha Township (TW); Ching-Wen Hsiao, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 38 days.

(21) Appl. No.: 13/420,405

(22) Filed: Mar. 14, 2012

(65) Prior Publication Data
US 2013/0241052 A1    Sep. 19, 2013

(51) Int. Cl.
*H01L 21/44* (2006.01)
*H01L 23/498* (2006.01)

(52) U.S. Cl.
USPC ........... 257/739; 257/734; 257/737; 257/738; 257/E23.141; 257/E23.142; 438/612; 438/613; 438/614; 438/678

(58) Field of Classification Search
USPC ........................................ 257/774
See application file for complete search history.

(56) References Cited

U.S. PATENT DOCUMENTS

| | | | |
|---|---|---|---|
| 2009/0130840 A1* | 5/2009 | Wang et al. | 438/614 |
| 2011/0210452 A1* | 9/2011 | Roozeboom et al. | 257/774 |
| 2012/0126417 A1* | 5/2012 | Chiu | 257/774 |

* cited by examiner

*Primary Examiner* — Victor A Mandala
*Assistant Examiner* — William Harriston
(74) *Attorney, Agent, or Firm* — Slater and Matsil, L.L.P.

(57) ABSTRACT

Solder on slot connections in package on package structures. An apparatus includes a substrate having a front side surface and a back side surface; a first passivation layer disposed over at least one of the front side and back side surfaces; at least one via opening formed in the first passivation layer; a conductor layer disposed over the first passivation layer, coupled to the at least one via and forming a conductive trace on the surface of the first passivation layer; a second passivation layer formed over the conductor layer; and at least one slot opening formed in the second passivation layer and exposing a portion of the conductive trace for receiving a solder connector. In additional embodiments the substrate may be a semiconductor wafer. Methods for forming the structures are disclosed.

19 Claims, 6 Drawing Sheets

METHODS AND APPARATUS FOR SOLDER ON SLOT CONNECTIONS IN PACKAGE ON PACKAGE STRUCTURES

BACKGROUND

Advances in packaging and integrated circuit assembly processes are increasing the use of integrated circuits or multiple integrated circuits mounted on interposers, wafers or substrates to form modules that are then subsequently mounted to printed circuit boards ("PCBs") to form complete systems. For example, an integrated circuit may be mounted as a "flip chip" on a substrate that carries solder connectors such as solder balls in a grid array to form a "flip chip ball grid array" ("FC-BGA") assembly; this assembly may then be mounted to a system board. As the use of increasingly advanced integrated circuits continues and the circuits are used in ever smaller and denser devices, such as portable and battery powered devices, the need for smaller, thinner, and less costly techniques to couple integrated circuit devices and assembled circuit modules to PCBs also continues to increase.

In addition, the use of stacked arrangements such as stacked dies and package-on-package ("PoP") arrangements are increasingly used. Memory modules and integrated circuits may be vertically arranged in this three dimensional ("3D") structure. Stacking integrated circuit devices or packaged devices reduces the area needed on the system board, and increases the circuit density to provide system assemblies for mounting to a system board. For example, a memory IC or a complete memory module may be assembled together in a PoP structure with another integrated circuit such as a logic IC, processor, or application processor unit ("APU"), which might be a user defined application specific integrated circuit ("ASIC"). The assembly, which may be referred to as a "package on package" or "PoP" structure, may then be disposed on a substrate or interposer using additional solder connections, for final mounting to a system board using external solder connections, for example, using controlled collapse chip connectors ("C4") or solder balls. In a typical arrangement, an integrated circuit die may be mounted on the top surface of an interposer formed of a laminate material, silicon, ceramic, films and the like. A solder connection is made between the integrated circuit die and the interposer, using solder bumps, for example. The lower surface of the interposer may also have solder connectors, typically solder balls, arranged in a pattern that corresponds to a ball land or pad pattern on the system board. After the PoP assembly is mounted on the interposer, the completed interposer and PoP assembly may then be mounted on the system PCB using the solder balls, and thermal reflow to bond the PoP assembly to the system board.

The assemblies may have solder connections such as solder bumps, pillars or columns disposed on one surface. Through vias may be formed extending through the PoP assembly and coupled to the redistribution layers ("RDL") or the solder connections. The RDL layers of the APU are conventionally coupled to the solder connectors using conductive pads formed over an uppermost passivation layer. The solder connections are then referred to as "solder on pads" or "SOP" technology. Forming these solder pads requires photolithographic processes, a specific photo mask for photoresist exposure, and additional metallization and metal patterning steps, which increases costs and lowers throughput by adding manufacturing steps.

BRIEF DESCRIPTION OF THE DRAWINGS

For a more complete understanding of the illustrative embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
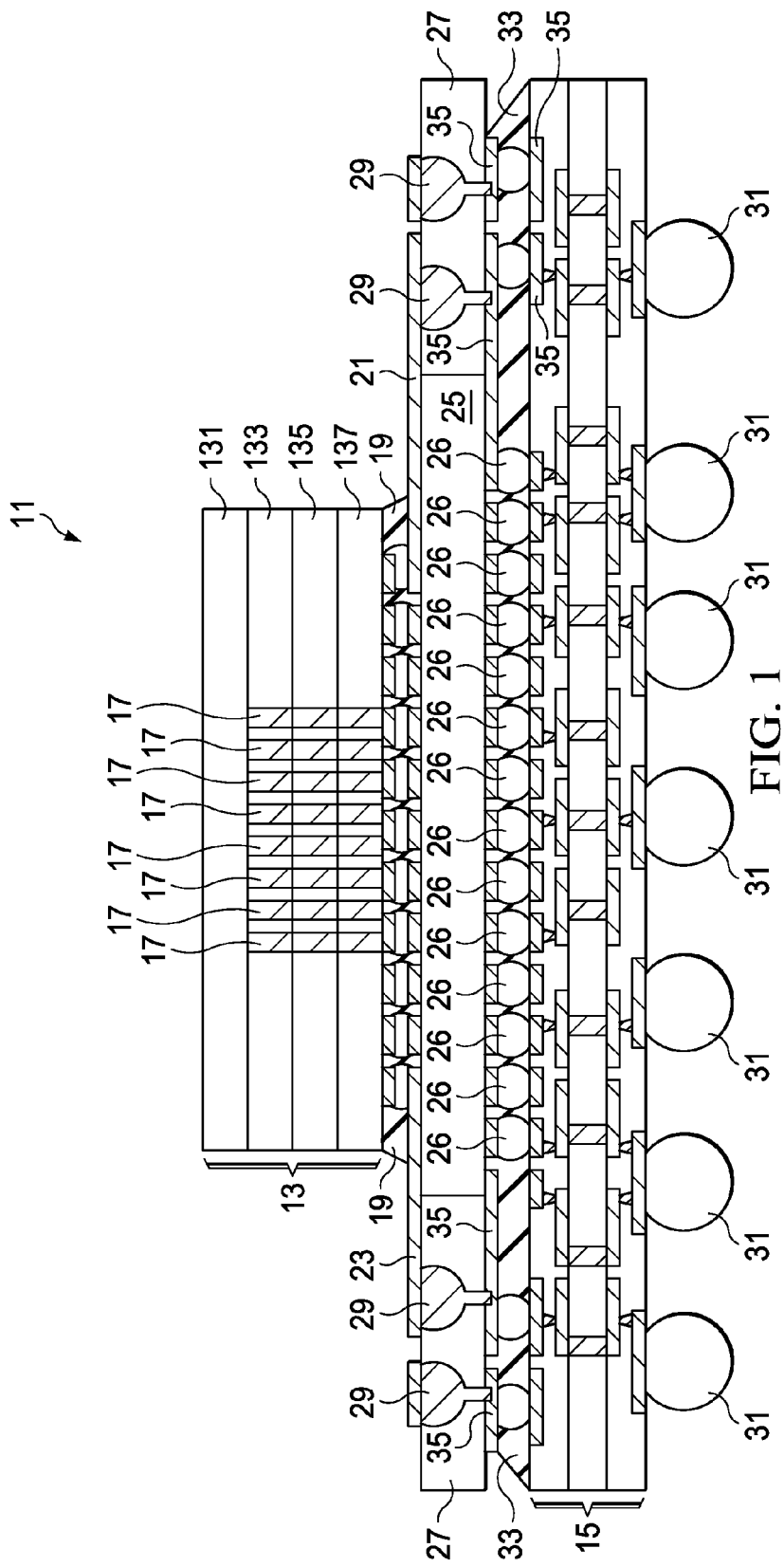
FIG. 1 depicts a cross-sectional view of a structure for use in illustrating the embodiments.

The making and using of the presently preferred embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the embodiments, and these examples do not limit the scope of this description and do not limit the scope of the appended claims.

The embodiments herein are illustrative examples but do not limit the scope of the disclosure and do not limit the scope of the appended claims. Embodiments of this disclosure include methods for a solder on slot connection in a PoP structure. In the embodiments, solder is connected to a conductor formed in a redistribution layer by forming a slot opening in an overlying dielectric or passivation layer, exposing a portion of the conductor trace by forming an opening such as a slot opening, and subsequently receiving a solder connector, for example a solder bump from another packaged device or module positioned above the substrate, with the solder bump disposed on the portion of the trace exposed through the slot opening. A thermal reflow process may then be used to electrically and physically couple the solder connection to the exposed portion of the RDL trace. In an alternative approach, solder bumps may be formed on the RDL trace and formed extending through the slot opening for further connection processes. Connections to other devices may then be made using the solder bumps. The conventional solder pads over the uppermost dielectric or passivation layer, and the corresponding vias needed to couple the conventional RDL traces to the solder connectors, are eliminated. The use of the embodiments save costs and eliminate at the need for at least one photomask level and eliminate the corresponding photolithography steps, while attaining the same solder bump pitch and spacing as before, and with reliable solder connections.

Embodiments of this application apply to arrangements having vertically mounted devices using solder connections. In an example application, the embodiments enable package-on-package arrangements with, for example, memory modules disposed on a surface of an APU. The APU is packaged using an RDL layer. Solder bumps from the memory module are disposed in the slot openings to make the connections between the devices. Another RDL layer on the opposite side surface of the APU may be used to make solder bump connections in slot openings to, as non-limiting examples, a substrate or interposer for a BGA assembly. The RDL layers on each surface of the APU may have the embodiment slots formed in passivation layers to receive solder connections, thus eliminating the solder pads and vias used in prior approaches. Alternatively, the embodiments RDL layers and slot openings may be used on only one surface of the APU. The embodiments are not limited to use with integrated circuits or APUs, the slot openings and RDL layers may be used with interposers, substrates and wafers, including substrates with or without active circuitry, in applications where devices are mounted using solder connections to an RDL layer.

FIG. 1 depicts in a cross-sectional view an example PoP structure used to illustrate the application of the embodiments. In FIG. 1, PoP structure 11 includes a memory module 13 formed of a stack of memory integrated circuit dies numbered 131, 133, 135 and 137 vertically stacked and coupled by through vias 17 to form a module. Although four memory devices are shown in this example, more or less may be used, including a single memory device or many. The memory devices of memory module 13 may be dynamic RAMs, such as DRAMs, and may be double date rate such as DDR devices. The memory devices may be static RAMs such as SRAMs, or non-volatile devices such as EPROM or FLASH memory. Solder connectors 21, which may be, for example solder bumps, or alternatively solder pillars or columns, are used to couple the memory module 13 to another device. In FIG. 1, the memory module 13 is shown disposed on a surface of an APU 25. When the memory module 13 is disposed over the active surface or front of the APU 25, this may be referred to as a "face to face" bonding of the devices, or "F2F", although the embodiments are not so limited.

In FIG. 1, the solder connectors 21 are shown disposed in an underfill layer 19, which is a compliant material that provides stress relief and protection for the solder connectors 21. Underfill materials provide some stress relief and may include thermally conductive filler materials, to assist in handling mechanical stress from thermal expansion. Resins, epoxies, polymers, and the like may be used. No flow underfill or NUF, capillary underfill, or others may be used. Solder pads are formed in a conductor layer 23 on the surface of APU 25 to receive the solder connectors 21. A molded layer 27 may be formed using mold compound; this mold compound portion forms the package for APU 25, and enables additional trace area and pad area to receive the many connections from the memory module 13. The molded layer 27 adds support and protection to the APU 25. In mounting very wide data word memory modules, many connections must be made, such as 1200 or more, due to the number of data lines in the very wide memory, and further due to the number of address and control bits required to address the large memory arrays. The area and spacing needed to provide solder pad connections for all of these may well exceed the surface area available on APU 25, so that additional traces are used to route the memory connections to solder pads formed outside of the area of APU 25 on the surface of the molded layers 27. Additional connective paths may be provided by through vias such as 29 extending vertically through the molded layer 27.

Figure 2:
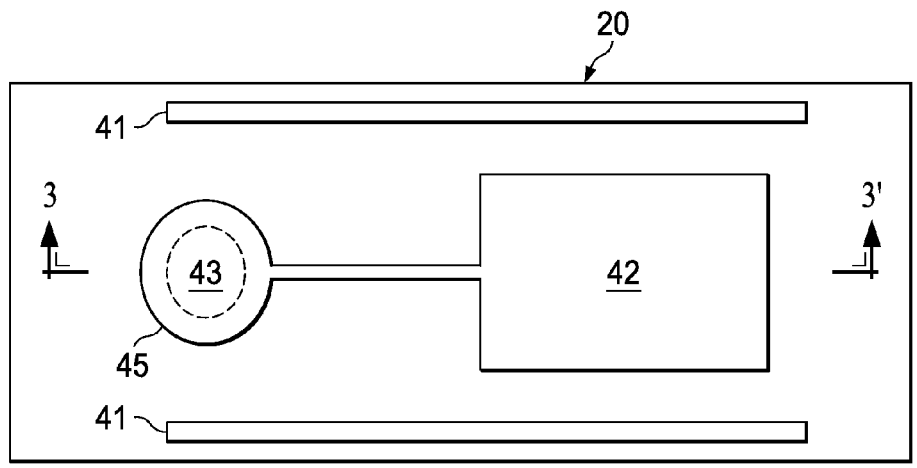
FIG. 2 depicts in a plan view an embodiment at an intermediate process step.

Although not shown in FIG. 2, through vias may be formed through the APU 25 as well. If the APU is a silicon integrated circuit, these through vias may be referred to as "through silicon vias" or "TSVs"; however, the embodiments are not limited to any particular device or substrate.

A second group of solder connectors 26 is shown on the bottom surface of APU 25 and these are also typically solder bumps, pillars, columns or cubes. These connectors are coupled to the traces 35 of the interposer 15. These connectors are protected by underfill 33. This connection type may be referred to as "bump on trace" or "BOT". In addition, interposer 15 has external connection solder balls 31 on its bottom surface, for mounting the PoP assembly 11 to a system board (not shown). Interposer 15 may be a ceramic, plastic, laminate, film or other insulating layer covered with redistribution layers, for example the interposer 15 may be formed of BT resin, FR4, or the like and may include copper or aluminum metallization traces. The interposer 15 provides signal remapping and additional physical support to the APU 25 and memory module 13. The interposer 15 may also provide some additional thermal stress relief between the APU 25 and the system board (not shown) that PoP assembly 11 is finally going to be mounted to.

In forming the structure of FIG. 1, the memory module 13 may be mounted on the APU 25 using a thermal reflow process. A memory module 13 may be aligned with and positioned on the solder pads of the APU 25. Thermal energy is applied to melt and bond the solder connectors 21 of the memory module 13 to the solder pads on the upper surface of APU 25, as shown in FIG. 1. These steps may be done in a wafer level process using WLP techniques. After the APU and memory modules are assembled at the wafer stage, they may be separated into individual assemblies. These assembled parts may then be mounted to the upper surface of interposer 15 using additional solder reflow and underfill steps. PoP assembly 11 is then ready for mounting to a system board using solder balls 31.

FIG. 2 depicts, in a plan view, a portion of an RDL layer formed on one surface of a substrate 20. In one non-limiting, illustrative example, the substrate 20 may be a portion of APU 25 as shown in FIG. 1. However, the embodiments have many applications and substrate 20 could be any substrate including a semiconductor interposer, or any other substrate with electrical connections in an RDL such as pads or traces for receiving a signal from a solder connector such as a solder bump. In FIG. 2, traces 41 are shown disposed on the surface of a first passivation layer (not visible in this plan view) that is formed over the surface of the substrate 20. The first passivation layer may be a polyimide layer, PBO, BCB, a non-photosensitive polymer, and in alternative embodiments, may be formed of a nitride, carbide or other dielectric. Typically a layer of polyimide is used. A conductive via 43 is formed in an opening in the first passivation layer beneath one end of the trace 45, which extends from an area overlying the via across the portion of the APU 25 shown in the plan view of FIG. 2. Via 43 electrically couples the trace 45 to a conductive element such as a circuit bond pad (not shown for simplicity) on the substrate 20. If the substrate is a logic integrated circuit, for example, then the via 43 will couple to a bond pad that provides an electrical path to circuitry formed within that logic integrated circuit.

A pad area 42 is shown formed as part of trace 45. This rectangular pad area 42 is arranged for receiving a solder connector, as is explained in detail below. Additional conductive traces 41 pass by the trace 45 as shown in FIG. 2, and these traces 41 may also have via portions, and pad areas, outside of the area of substrate 20 illustrated here.

Note that in this non-limiting example, the portion of the trace 45 between the pad area 42 and via 43 is narrower than either pad area 42 or the via area 43. However, the trace 45 may be of any width and, in another alternative embodiment, the trace 45 may be of a uniform width throughout including the pad area 42 and the portion over via 43. Traces 41 may be of wider or narrower widths depending on the application, and the resistivity of the materials. Typically a low resistance path is desired, but in some applications, that may not the case. Narrower or wider traces may be used to obtain specific resistances, if desired.

Figure 3:
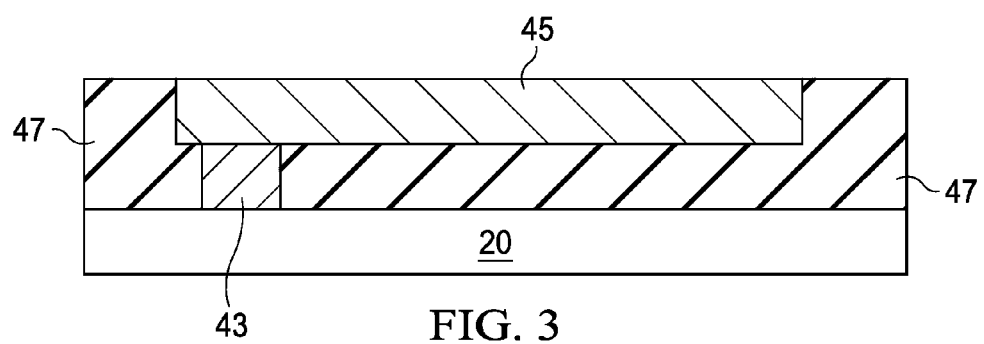
FIG. 3 depicts in a cross sectional view the structure of FIG. 2.

FIG. 3 depicts the cross section labeled 3-3' shown in the plan view of FIG. 2. In FIG. 3, the first dielectric or passivation layer 47 is shown over one surface of substrate 20. A via 43 is shown formed in an opening in the passivation layer 47, and trace 45 is shown deposited over the passivation layer 47.

To form the conductive trace 45, a layer of conductive material is formed over the passivation layer 47 on the substrate 20. This may be done, for example, using electroplating or electroless deposition. The conductor layer may comprise materials known as conductors used with semiconductor materials such as aluminum, copper, gold, and the like and may be formed of alloys or of multiple layers. Adhesion layer materials and diffusion barrier materials may be used under the conductor material or coating the conductor material, such as tungsten, titanium and the like. Typically the conductor layer comprises copper and traces 41 and 45 and via 43 are formed of copper. Aluminum may also be used. Conductive plugs may be used in filling the vias such as via 43.

A photolithographic process may be performed using a photomask with photoresist processes such as photoresist deposition, photoresist exposure using a photomask and a radiation source, photoresist develop, and then performing the conductive layer etch, followed by a post-etch clean, and finally a PR strip. These process steps pattern the conductor material and form the traces 41, 45, and the pad area 42, as shown in FIG. 2 and in cross section in FIG. 3.

Figure 4:
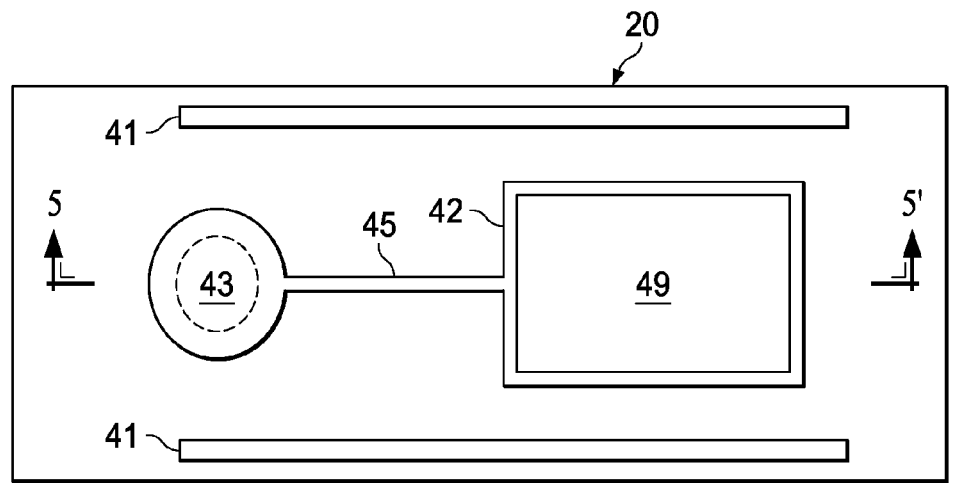
FIG. 4 depicts in a plan view the embodiment of FIG. 2 following additional processing steps.

FIG. 4 depicts in a plan view the substrate 20 of FIG. 2 following additional processing. In FIG. 4, substrate 20 is shown with conductive traces 41 and 45, via 43 and pad area 42 covered by a second passivation layer (not visible in this view). The conductive traces 41, 45 and pad area 42 are shown with dashed outlines as they are now covered by a second passivation layer as described below. A slot shaped opening 49 is shown formed in this second passivation layer exposing a portion of the pad area 42. The slot opening 49 may be, for example, around the size of a C4 bump, or about 95 microns in one example. Other slot sizes compatible with the particular sizes of solder connections being used are also contemplated and form alternative embodiments.

The first and second passivation layers and the conductive traces form the RDL layer on the substrate 20, mapping the via 43 to the pad area 42. In one example RDL process, single damascene metal processes may be used. CMP processes may be used but are not necessary in all embodiments.

Figure 5:
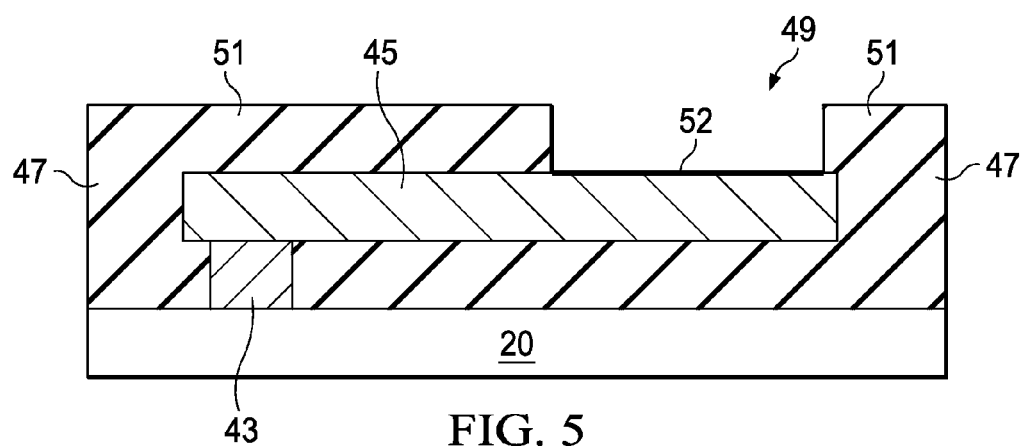
FIG. 5 depicts a cross-section of the embodiment of FIG. 4.

FIG. 5 depicts the cross section 5-5' from FIG. 4. In FIG. 5, substrate 20 is depicted in cross section with the first passivation layer 47, via 43, conductive trace 45, and a second passivation layer 51. Slot opening 49 is shown formed in the passivation layer 51 and exposing a portion of the trace 45. A plating layer, which may be nickel, is shown covering the trace 45 in the slot opening 49. Alternative plating layers such as a nickel, gold, nickel-gold, gold, palladium, electroless nickel immersion gold ("ENIG"), or electroless nickel, electroless palladium, immersion gold ("ENEPIG") may be used as a plating layer 52 over the trace 45 in the slot opening 49. This plating layer prevents intermetallic compound ("IMC") formation forming and from consuming the copper trace material when a solder connector is later disposed on the trace 45 in the opening, or slot, 42. In an example, this plating layer was formed about 2 microns in thickness, but many other thicknesses may be used. Electroplating and electroless plating may be used to form this layer.

Figure 6:
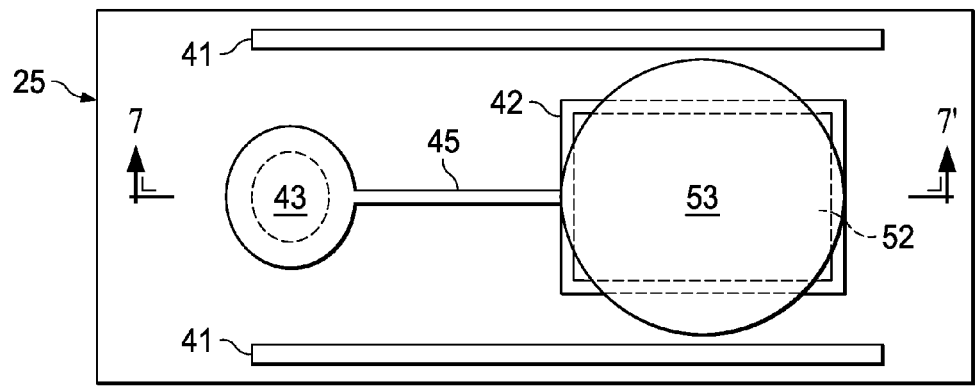
FIG. 6 depicts in a plan view the embodiment of FIG. 4 following additional processing steps.

FIG. 6 depicts in another plan view the portion of the substrate 20 of FIG. 4, following additional processing. In FIG. 6 a solder connector, here solder bump 53, which may be alternatively shaped as a pillar, stud, column or cube, is disposed over the plating layer 52 in the slot opening 49 over the pad area 42, the solder bump 53 then extends through the slot in the passivation layer (not visible in this plan view). The remaining elements are as described above.

Figure 7:
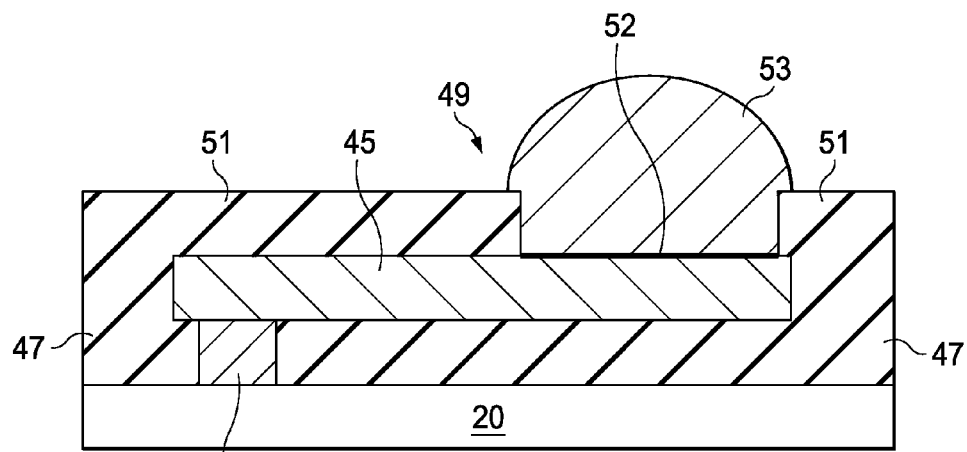
FIG. 7 depicts in a cross-sectional view the embodiment of FIG. 6.

FIG. 7 depicts the cross section 7-7' of FIG. 6. In FIG. 7, a solder connector, such as solder bump 53, but not limited to a solder bump, is shown disposed on the plating layer 52 and extending upwards through the slot opening 49 in passivation layer 51, and contacting the plating layer 52 on trace 45. Pad area 42 is not visible in this cross sectional view but is part of trace 45 and is beneath the plating layer 52. The solder bump 53 may be used to make connections to other devices, such as memory modules, or interposer boards.

Figure 8:
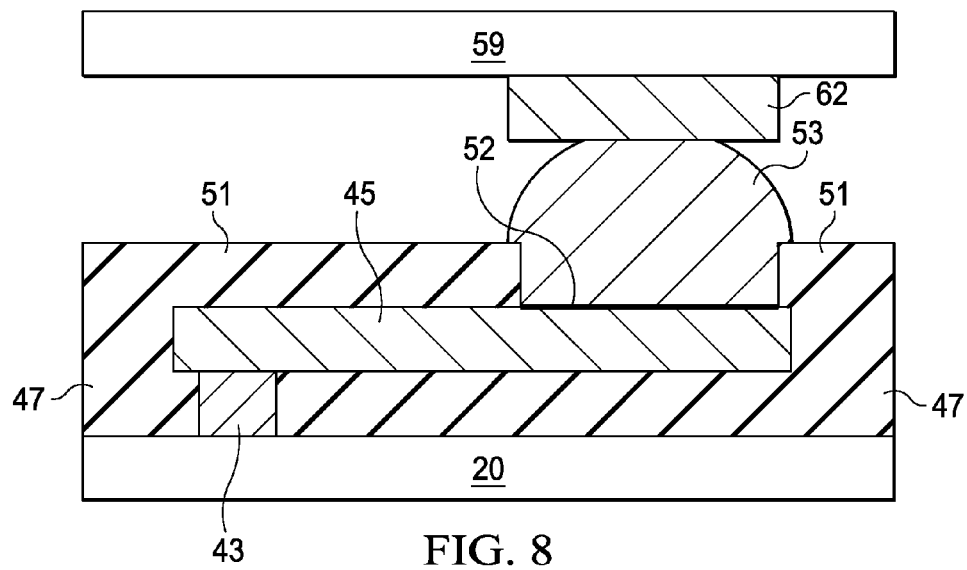
FIG. 8 depicts in a cross-sectional view the embodiment of FIG. 6 in an example application.

FIG. 8 depicts the embodiment of FIG. 5 in another cross section to illustrate an application of the embodiments. In FIG. 8, a device 59, which may be a module such as in FIG. 1, a single integrated device, or a substrate or interposer, has solder bumps on a bottom surface including a pad 62 and solder bump 53 is mounted to the plating layer 52. The solder bump 53 is positioned in slot opening 49 and bonded to the substrate 20 following a thermal reflow step. In this application, the slot opening in passivation layer 51 does not receive a solder bump, but instead remains open, and the solder bump is carried by the upper device, here device 59. In one example, referring back to FIG. 1, the embodiments include a logic integrated circuit or APU as device 20, and the upper device 59 would be a memory module with solder bumps for connection to the plating layer 52 of the embodiments. Thus, in this example embodiment, the substrate 20 does not have to receive solder bump 53 prior to connection; instead in some applications the slot opening in passivation layer 51 receives a solder bump from a device being mounted to the substrate 20.

In the above examples, an RDL layer and passivation layers are shown only on one surface of substrate 20. Referring to FIG. 1, however, it is clear that in an application where an APU is coupled to a memory module on one surface, and an interposer on the other surface, the slot connection opening of the embodiments may be used on both the upper and lower RDL layers, and connections to both the memory module, and the interposer, may be made by solder bumps disposed in the slot openings. Alternatively, the slot openings may only be used for connections on one surface or the other surface, the embodiments do not require that all solder connections have the slot openings and the embodiments may be used along with conventional solder on pad connections on different surfaces, and this arrangement is also contemplated as another alternative embodiment within the scope of the appended claims.

Also, in the non-limiting examples shown above, a single layer of conductive material is shown in the RDL over the substrate, with two passivation layers. However, in practical applications, additional layers of conductor and dielectric or passivation layers may be provided. In those alternative embodiments, the solder on slot connections will be formed in the outermost passivation layers.

Figure 9:
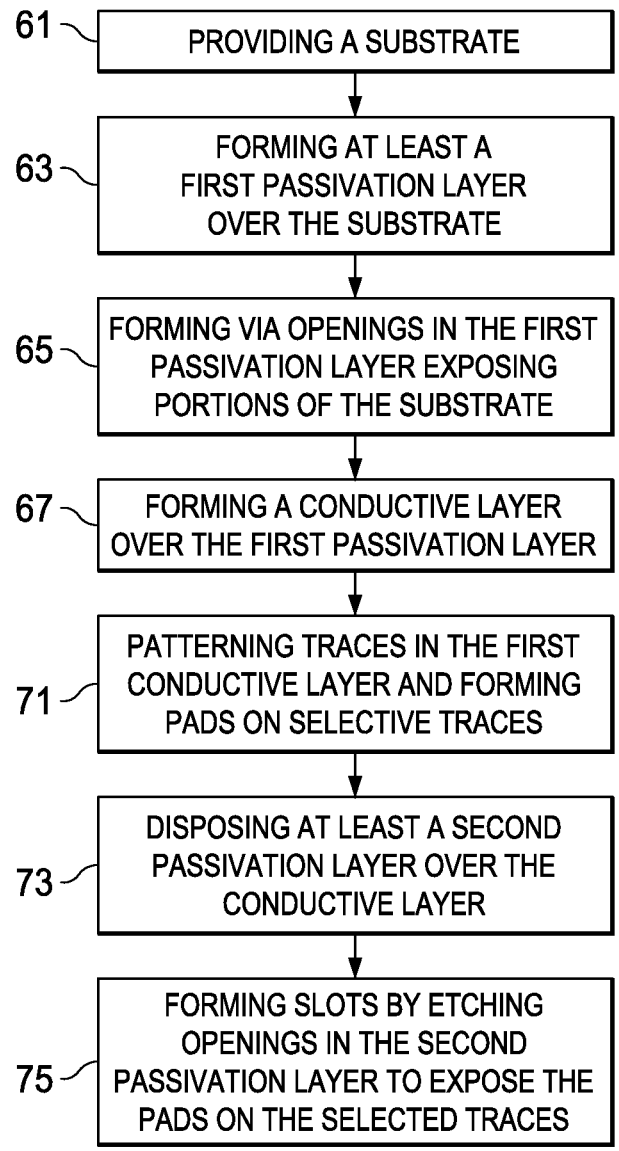
FIG. 9 depicts in a flow diagram an example method embodiment.

FIG. 9 depicts in a flow diagram the steps for an example method embodiment. In step 61, a substrate is provided. As explained above, this substrate may be a semiconductor device, an integrated circuit, or an interposer or other substrate. In step 63, at least a first passivation layer is formed over the substrate. As described above, several layers could be used. In step 65, via openings are formed in the first passivation layer. In step 67, a conductive layer is formed over the first passivation layer, typically a copper or aluminum layer is used. The conductive layer may fill the vias formed in step 65 as well, or conductive plugs could be used. In step 71, the traces are patterned to form pads on selective traces. Photolithography, exposure, develop, conductor etch, and PR strip steps may be performed.

In step 73, a second passivation layer is formed over the conductive layer. Again, various dielectric materials may be used, as described above. In step 75, slots for receiving solder connections are formed by etching openings in the second passivation layer to expose the pads. The method thus far forms the embodiment as shown in FIG. 5, for example. This may be used as in FIG. 8 to receive solder bumps from another device mounted on the substrate. Alternatively, solder bumps may be formed on the traces in the slot portions, as shown in FIG. 7, for example. The plating layer may be formed on the traces in the slot portions, as shown in FIG. 7; in an alternative embodiment this layer may be omitted.

Figure 10:
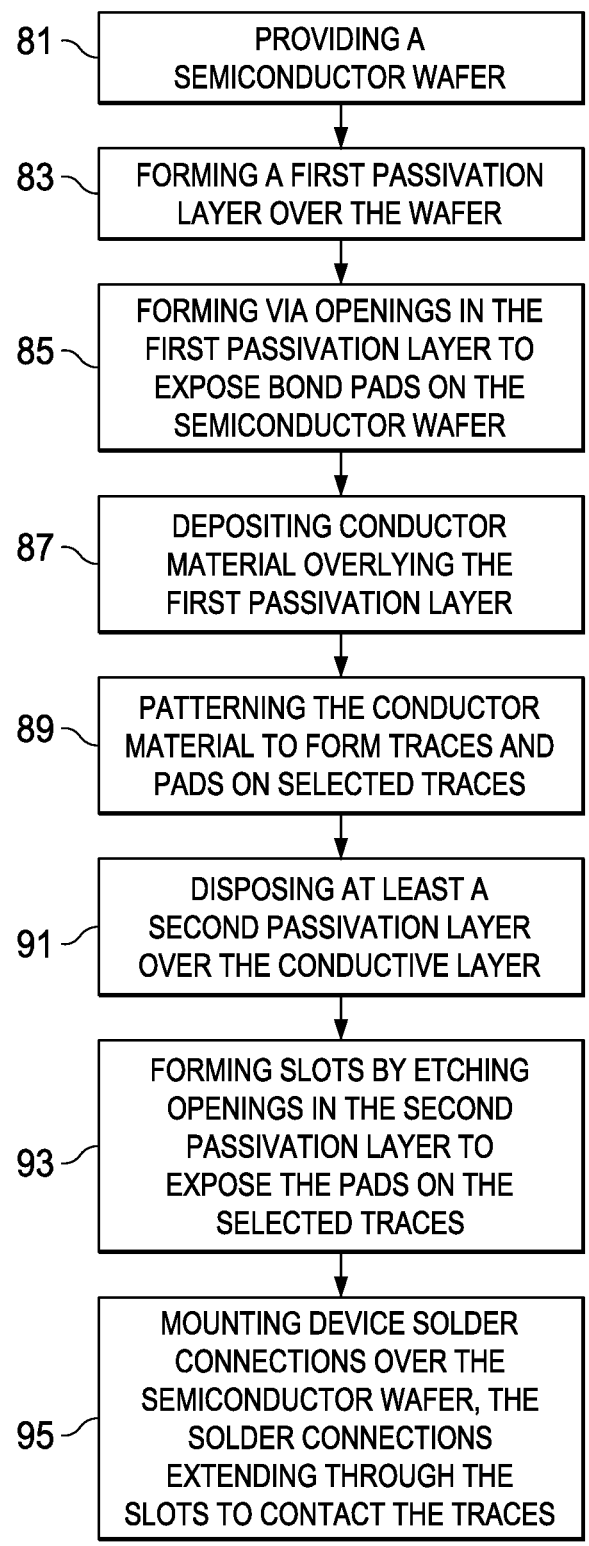
FIG. 10 depicts in a flow diagram another example method embodiment.

FIG. 10 depicts an alternative method embodiment in a flow diagram. In FIG. 10, the method forms the embodiments as a wafer level process. In step 81, a semiconductor wafer is provided. The wafer may include many integrated circuits, such as logic devices or APUs, formed thereon. In step 83, a first passivation layer such as a polyimide layer is formed over the wafer. In step 85, via openings are formed in the first passivation layer to expose bond pads on the semiconductor wafer. In step 87, a layer of conductor material is deposited overlying the first passivation layer. In step 89, this conductor layer is patterned to form traces and pads on selected traces. In step 91, a second passivation layer, which may be a polyimide or other dielectric material as described above, is formed on the conductor layer. In step 93, the slot openings are formed by patterning the second passivation layer to expose the pads on the selected traces. In step 95, devices with solder connections are mounted over the semiconductor wafer with the solder connections, which may be solder bumps as described above, extending through the slots to contact the traces. Following these steps, the semiconductor wafer may be singulated into individual units by wafer dicing or sawing, the individual units ready for mounting to interposers as described above.

In an embodiment, an apparatus includes a substrate having a front side surface and a back side surface; a first passivation layer disposed over at least one of the front side and back side surfaces; at least one via opening formed in the first passivation layer; a conductor layer disposed over the first passivation layer, coupled to the at least one via and forming a conductive trace on the surface of the first passivation layer; a second passivation layer formed over the conductor layer; and at least one slot opening formed in the second passivation layer and exposing a portion of the conductive trace for receiving a solder connector.

In a further embodiment, the above apparatus includes a plating layer disposed over the portion of the conductive trace portion exposed in the at least one slot opening. In still another embodiment, the plating layer comprises nickel. In still a further embodiment, the plating layer is one of nickel, gold, palladium, electroless nickel immersion gold (ENIG), and electroless nickel electroless palladium immersion gold (ENEPIG).

In another embodiment, the above apparatus further includes a third passivation layer formed on the at least one other of the front side surface and the back side surface; at least one second via opening formed in the third passivation layer; a second conductor layer disposed over the third passivation layer, coupled to the at least one via and forming a second conductive trace on the surface of the third passivation layer; a fourth passivation layer formed over the conductor layer; and at least one slot opening formed in the fourth passivation layer and exposing a portion of the second conductive trace for receiving another solder connector.

In still another embodiment, in the above described apparatus embodiments, the substrate includes a semiconductor device. In a further embodiment, in the above described embodiments, the semiconductor device further includes a logic integrated circuit. In another embodiment, in the above described embodiments, the substrate is a semiconductor wafer.

In still another embodiment, a device having solder bumps thereon is disposed over the second passivation layer and at least one solder bump is disposed in the at least one slot opening formed in the second passivation layer, the at least one solder bump making electrical connection to the conductive trace.

In yet another embodiment, an apparatus is provided and includes a semiconductor wafer having a front side surface and a back side surface and having integrated circuits formed therein, and further including: a first passivation layer disposed over at least one of the front side and back side surfaces; at least one via opening formed in the first passivation layer; a conductor layer disposed over the first passivation layer, coupled to the at least one via and forming a conductive trace on the surface of the first passivation layer; a second passivation layer formed over the conductor layer; and at least one slot opening formed in the second passivation layer and exposing a portion of the conductive trace for receiving a solder connector; and another integrated circuit device having solder bumps on a surface mounted to the semiconductor wafer, with at least one of the solder bumps extending through the at least one slot opening in the second passivation layer and making electrical contact to the portion of the conductive trace.

In a further embodiment, the integrated circuits formed in the semiconductor wafer are logic integrated circuits. In still another embodiment. The another integrated circuit device is at least one memory integrated circuit. In still another embodiment, the another integrated circuit device is a memory module. In a further embodiment, a third passivation layer formed on the at least one other of the front side surface and the back side surface of the semiconductor wafer; a second conductor layer disposed over the third passivation layer, forming a second conductive trace on the surface of the third passivation layer; a fourth passivation layer formed over the second conductor layer; and at least one slot opening formed in the fourth passivation layer and exposing a portion of the second conductive trace for receiving another solder connector; and an interposer substrate having solder bumps mounted to the back side surface of the semiconductor wafer, with at least one of the solder bumps extending into the at least one slot opening in the fourth passivation layer and making electrical connection to the second conductive trace.

In still another embodiment, a method includes forming a first passivation layer over a first surface of a substrate; forming a first conductive layer over the first passivation layer;

patterning the first conductive layer to form traces and a pad area on selected ones of the traces; forming a second passivation layer over the first conductive layer; and opening slots in the second passivation layer to expose the pad area on at least one of the traces of the first conductive layer.

In another embodiment, the method further includes mounting an integrated circuit device having solder connectors to the substrate, at least one solder connector extending through one of the slots in the second passivation layer to contact at the pad area of the at least one of the traces of the first conductive layer. In yet another embodiment, the integrated device is a memory module. In still another embodiment, the substrate is an integrated circuit device. In still a further embodiment, the substrate is a semiconductor wafer. In another embodiment, the method further includes forming a third passivation layer over a second surface of the substrate; forming a second conductive layer over the third passivation layer; patterning the second conductive layer to form traces and at pads on selected ones of the traces; forming a fourth passivation layer over the second conductive layer; and forming slot openings in the fourth passivation layer exposing the pads on the selected ones of the traces, for receiving solder connections.

Although the illustrative embodiments and advantages have been described in detail, it should be understood that various changes, substitutions, and alterations can be made herein without departing from the spirit and scope of the appended claims. For example, alternate materials may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus, comprising:
   a substrate having a front side surface and a back side surface;
   a first passivation layer disposed over at least one of the front side and back side surfaces;
   at least one via extending through respective openings formed in the first passivation layer;
   a conductor layer disposed over the first passivation layer, coupled to the at least one via and forming a conductive trace on the surface of the first passivation layer, the conductor layer being a continuous layer of conductive material and having a planar upper surface;
   a second passivation layer formed over the conductor layer;
   at least one slot opening formed in the second passivation layer and exposing a portion of the conductive trace for receiving a solder connector;
   a plating layer over and contacting the portion of the conductive trace exposed in the at least one slot opening, the plating layer not extending over the second passivation layer; and
   a solder connector over and contacting the plating layer in the at least one slot opening.

2. The apparatus of claim 1 wherein the plating layer comprises nickel.

3. The apparatus of claim 1 wherein the plating layer comprises one selected from the group consisting essentially of nickel, gold, palladium, electroless nickel immersion gold (ENIG), and electroless nickel electroless palladium immersion gold (ENEPIG).

4. The apparatus of claim 1, and further comprising:
   a third passivation layer formed on the other of the at least one the front side surface and the back side surface;
   at least one second via extending through respective openings formed in the third passivation layer;
   a second conductor layer disposed over the third passivation layer, coupled to the at least one second via and forming a second conductive trace on the surface of the third passivation layer;
   a fourth passivation layer formed over the conductor layer; and
   at least one slot opening formed in the fourth passivation layer and exposing a portion of the second conductive trace for receiving another solder connector.

5. The apparatus of claim 1, wherein the substrate comprises a semiconductor device.

6. The apparatus of claim 5, wherein the semiconductor device further comprises a logic integrated circuit.

7. The apparatus of claim 1, wherein the substrate comprises a semiconductor wafer.

8. The apparatus of claim 1, wherein the solder connector comprises a solder bump and further comprising a device electrically coupled to the at least one solder bump.

9. An apparatus, comprising:
   a semiconductor wafer having a front side surface and a back side surface and having integrated circuits formed therein, and further comprising:
   a first passivation layer disposed over at least one of the front side and back side surfaces;
   at least one via extending through respective openings formed in the first passivation layer;
   a conductor layer disposed over the first passivation layer, coupled to the at least one via and forming a conductive trace on the surface of the first passivation layer;
   a second passivation layer formed over the conductor layer;
   at least one slot opening formed in the second passivation layer and exposing a portion of the conductive trace for receiving a solder connector; and
   a plating layer over and contacting the conductor layer, the plating layer having an uppermost surface lower than an uppermost surface of the second passivation layer; and
   another integrated circuit device having solder bumps on a surface mounted to the semiconductor wafer, with at least one of the solder bumps extending through the at least one slot opening in the second passivation layer and making electrical and physical contact to the portion of the plating layer.

10. The apparatus of claim 9, wherein the integrated circuits formed in the semiconductor wafer are logic integrated circuits.

11. The apparatus of claim 9, wherein the another integrated circuit device is at least one memory integrated circuit.

12. The apparatus of claim 11, wherein the another integrated circuit device is a memory module.

13. The apparatus of claim 9, and further comprising:
a third passivation layer formed on the at least one other of the front side surface and the back side surface of the semiconductor wafer;
a second conductor layer disposed over the third passivation layer, forming a second conductive trace on the surface of the third passivation layer;
a fourth passivation layer formed over the second conductor layer; and
at least one slot opening formed in the fourth passivation layer and exposing a portion of the second conductive trace for receiving another solder connector; and
an interposer substrate having solder bumps mounted to the back side surface of the semiconductor wafer, with at least one of the solder bumps extending into the at least one slot opening in the fourth passivation layer and making electrical connection to the second conductive trace.

14. A method, comprising:
forming a first passivation layer over a first surface of a substrate;
forming a first conductive layer over the first passivation layer;
patterning the first conductive layer to form traces and a pad area on selected ones of the traces;
forming a second passivation layer over the first conductive layer;
opening slots in the second passivation layer to expose the pad area on at least one of the traces of the first conductive layer;
forming a plating layer directly over and contacting the first conductive layer in the corresponding slots, the plating layer having an uppermost surface lower than an uppermost surface of the second passivation layer; and
forming a solder connector in the corresponding slots, the solder connector contacting the plating layer.

15. The method of claim 14, and further comprising:
mounting an integrated circuit device to the substrate.

16. The method of claim 15, wherein the integrated device is a memory module.

17. The method of claim 14 wherein the substrate is an integrated circuit device.

18. The method of claim 14 wherein the substrate is a semiconductor wafer.

19. The method of claim 14, and further comprising:
forming a third passivation layer over a second surface of the substrate;
forming a second conductive layer over the third passivation layer;
patterning the second conductive layer to form traces and at pads on selected ones of the traces;
forming a fourth passivation layer over the second conductive layer; and
forming slot openings in the fourth passivation layer exposing the pads on the selected ones of the traces, for receiving solder connections.

\* \* \* \* \*

UNITED STATES PATENT AND TRADEMARK OFFICE
CERTIFICATE OF CORRECTION

PATENT NO. : 8,766,441 B2  Page 1 of 1
APPLICATION NO. : 13/420405
DATED : July 1, 2014
INVENTOR(S) : Wei Sen Chang It is certified that error appears in the above-identified patent and that said Letters Patent is hereby corrected as shown below:

In the Claims

In Col. 10, line 10, claim 4, immediately after "one" insert --of--.

Signed and Sealed this
Second Day of September, 2014

Michelle K. Lee
*Deputy Director of the United States Patent and Trademark Office*